US012620448B2

(12) United States Patent
Dayacap et al.

(10) Patent No.:  US 12,620,448 B2
(45) Date of Patent:       May 5, 2026

(54) SOLID STATE DRIVE (SSD) WITH IN-FLIGHT ERASURE ITERATION SUSPENSION

(71) Applicant: SK hynix NAND Product Solutions Corp., Rancho Cordova, CA (US)

(72) Inventors: Justin R. Dayacap, Daly City, CA (US); Shantanu R. Rajwade, Santa Clara, CA (US); Kyung Jean Yoon, Santa Clara, CA (US); Ali Khakifirooz, Los Altos, CA (US); David J. Pelster, Longmont, CO (US); Yogesh B. Wakchaure, Folsom, CA (US); Xin Guo, San Jose, CA (US)

(73) Assignee: SK hynix NAND Product Solutions Corp., Rancho Cordova, CA (US)

( * ) Notice: Subject to any disclaimer, the term of this patent is extended or adjusted under 35 U.S.C. 154(b) by 53 days.

(21) Appl. No.: 18/752,493

(22) Filed: Jun. 24, 2024

(65) Prior Publication Data

US 2024/0347117 A1     Oct. 17, 2024

Related U.S. Application Data

(63) Continuation of application No. 16/727,794, filed on Dec. 26, 2019, now Pat. No. 12,051,472.

(51) Int. Cl.
*G11C 16/34*          (2006.01)
*G11C 16/16*          (2006.01)
*G11C 16/32*          (2006.01)

(52) U.S. Cl.
CPC .......... *G11C 16/3445* (2013.01); *G11C 16/16* (2013.01); *G11C 16/32* (2013.01); *G11C 2216/20* (2013.01)

(58) Field of Classification Search
CPC ..... G11C 16/3445; G11C 16/16; G11C 16/32; G11C 2216/20
See application file for complete search history.

(56) References Cited

U.S. PATENT DOCUMENTS

| | | | | |
|---|---|---|---|---|
| 9,223,514 | B2 * | 12/2015 | Hyun | ..................... G11C 16/16 |
| 9,679,658 | B2 | 6/2017 | Pelster et al. | |
| 10,108,369 | B2 | 10/2018 | Shin et al. | |
| 10,490,290 | B2 * | 11/2019 | Kondo | .............. G11C 16/3445 |
| 10,643,711 | B1 | 5/2020 | Yuan et al. | |
| 11,081,187 | B2 * | 8/2021 | Sharma | ................. G11C 16/32 |
| 11,942,159 | B2 * | 3/2024 | Kim | ..................... G11C 16/225 |
| 2019/0243577 | A1 | 8/2019 | Pelster et al. | |

OTHER PUBLICATIONS

Non-final Office Action dated Dec. 12, 2023 in U.S. Appl. No. 16/727,794, filed Dec. 16, 2019.
Advisory Action dated Sep. 21, 2023 in U.S. Appl. No. 16/727,794, filed Dec. 16, 2019.
Final Office Action dated Jun. 20, 2023 in U.S. Appl. No. 16/727,794, filed Dec. 16, 2019.
Non-final Office Action dated Jan. 20, 2023 in U.S. Appl. No. 16/727,794, filed Dec. 16, 2019.

* cited by examiner

*Primary Examiner* — Vanthu T Nguyen
(74) *Attorney, Agent, or Firm* — Byrne Poh LLP

(57)                ABSTRACT

An apparatus is described. The apparatus includes a memory chip having logic circuitry to suspend application of an erasure voltage, wherein, respective responses of the erasure voltage to a decision to suspend the application of the erasure voltage depend on where the erasure voltage is along its waveform.

18 Claims, 12 Drawing Sheets

SOLID STATE DRIVE (SSD) WITH IN-FLIGHT ERASURE ITERATION SUSPENSION

CROSS-REFERENCE TO RELATED APPLICATION

This application is a continuation of U.S. patent application Ser. No. 16/727,794, filed Dec. 26, 2019, which is hereby incorporated by reference herein in its entirety.

FIELD OF INVENTION

The field of invention pertains generally to the computing sciences, and, more specifically to a solid state drive (SSD) with in-flight erasure iteration suspension.

BACKGROUND

With the emergence of cloud-computing, machine learning, artificial intelligence and other "big-data" applications, the performance of non volatile mass storage has become a keen area of focus as the ability of these applications to execute as desired by their customers depends on the ability of mass storage to quickly respond to high rates of commands. As such, SSD designers are constantly seeking ways to improve the performance of their SSD devices.

FIGURES

A better understanding of the present invention can be obtained from the following detailed description in conjunction with the following drawings, in which.

DETAILED DESCRIPTION

Figure 1:
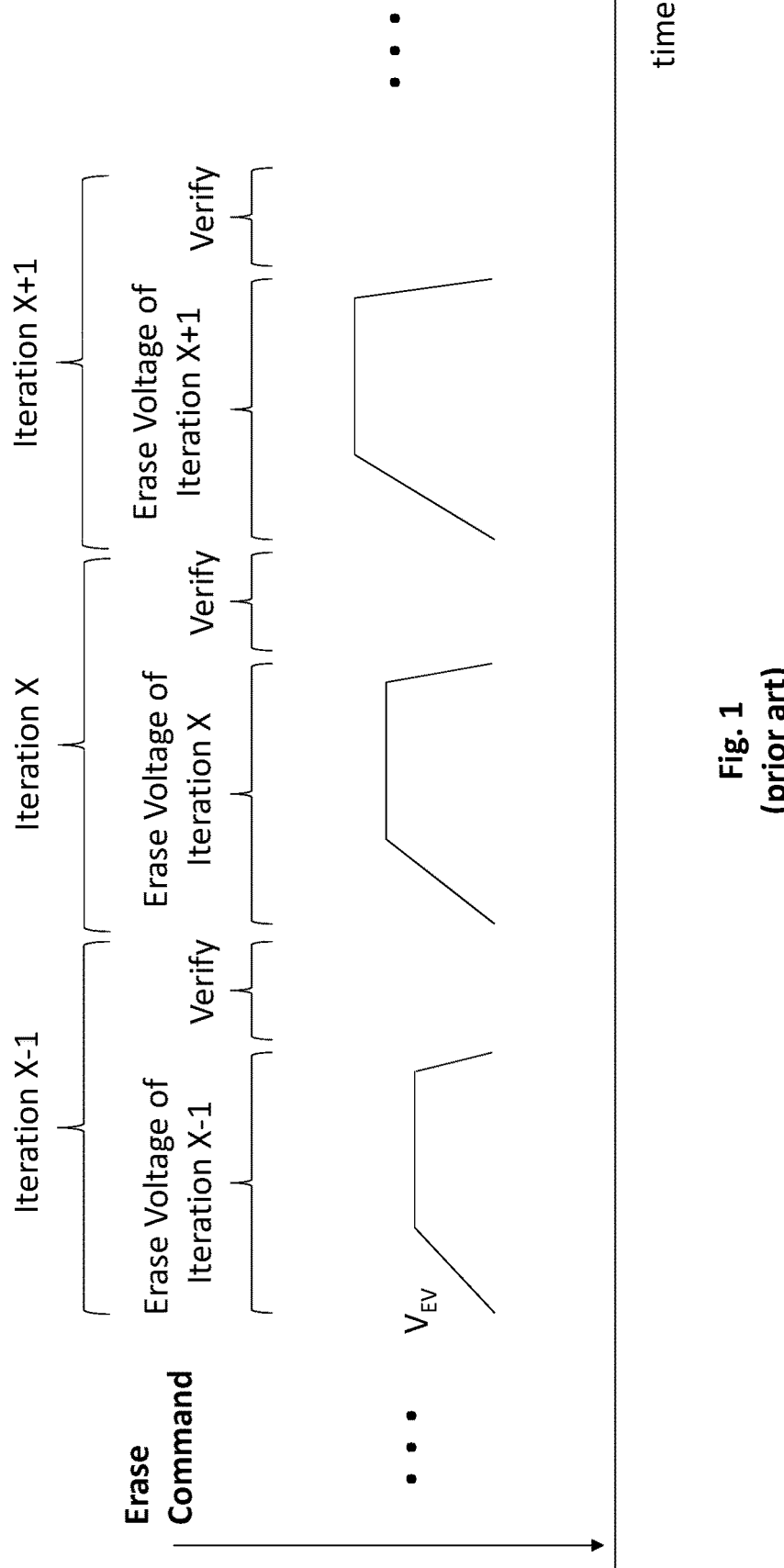
FIG. 1 (prior art) depicts a flash memory erasure process.

Blocks of flash memory are commonly erased before being written to. FIG. 1 depicts a traditional erasure process. As observed in FIG. 1, the erasure of a single block entails applying an erasure voltage ($V_{EV}$) to the block's storage cells and then checking ("verifying") whether all the cells in the block have been properly erased and, if not, stepping up the erasure voltage, applying the increased erasure voltage to the cells (or, at least the cells that have not been properly erased) and re-verifying. The process continues until all cells in the block have been properly erased. Traditionally, the erase of a single block was performed with a single erase command that was passed, e.g., from an SSD controller to the NAND flash storage chip whose block is to be erased.

As NAND flash storage cell densities increased, however, each block contained more and more storage cells. The erasure of an entire block therefore required the erasure of many more cells per erasure process. The increased number of cells per block resulted in a greater spread of cell responsivity to the applied erasure voltages (that is, as compared to earlier technologies, more cells per iteration were not properly erased) resulting in the execution of more erasure iterations to fully erase the block. The more erasure iterations translated to an undesired increased in the total time consumed erasing a block.

The increased time needed to fully erase a block unfortunately caused the quality of service (QOS) to fall for other operations/commands (e.g., reads) that were forced to wait for the erasure to complete. Thus, to the users/threads/applications that were waiting for these operations/commands to be performed, the overall SSD appeared to be a slow mass storage device.

U.S. Pat. No. 9,679,658 addressed this problem, as observed in FIG. 2, by breaking the erasure iterations into individual erasure command sequences. That is, for each erase iteration, the SSD controller sends an erase command 201 to the NAND flash memory device whose block is being erased. With each erasure iteration being performed as a separate erasure command, other commands, e.g., reads from other blocks of the same NAND memory chip targeted by the erasure could be inserted 202 in between the individual erasure iterations resulting in improved SSD speed from the perspective of all the users/threads/applications that use the SSD as a whole (only the user/thread/application whose block was being erased would observe decreased performance from prior generations, all other users/applications/threads of the SSD would observe improved performance).

Unfortunately, with the further increase in NAND flash storage cell densities and/or the increasing demands placed on SSD devices in high performance data center applications, "big-data" applications and the like, the time consumed by a single erasure iteration is too large in view of the number of commands/operations that must wait for the single erasure iteration to complete.

Figure 3:
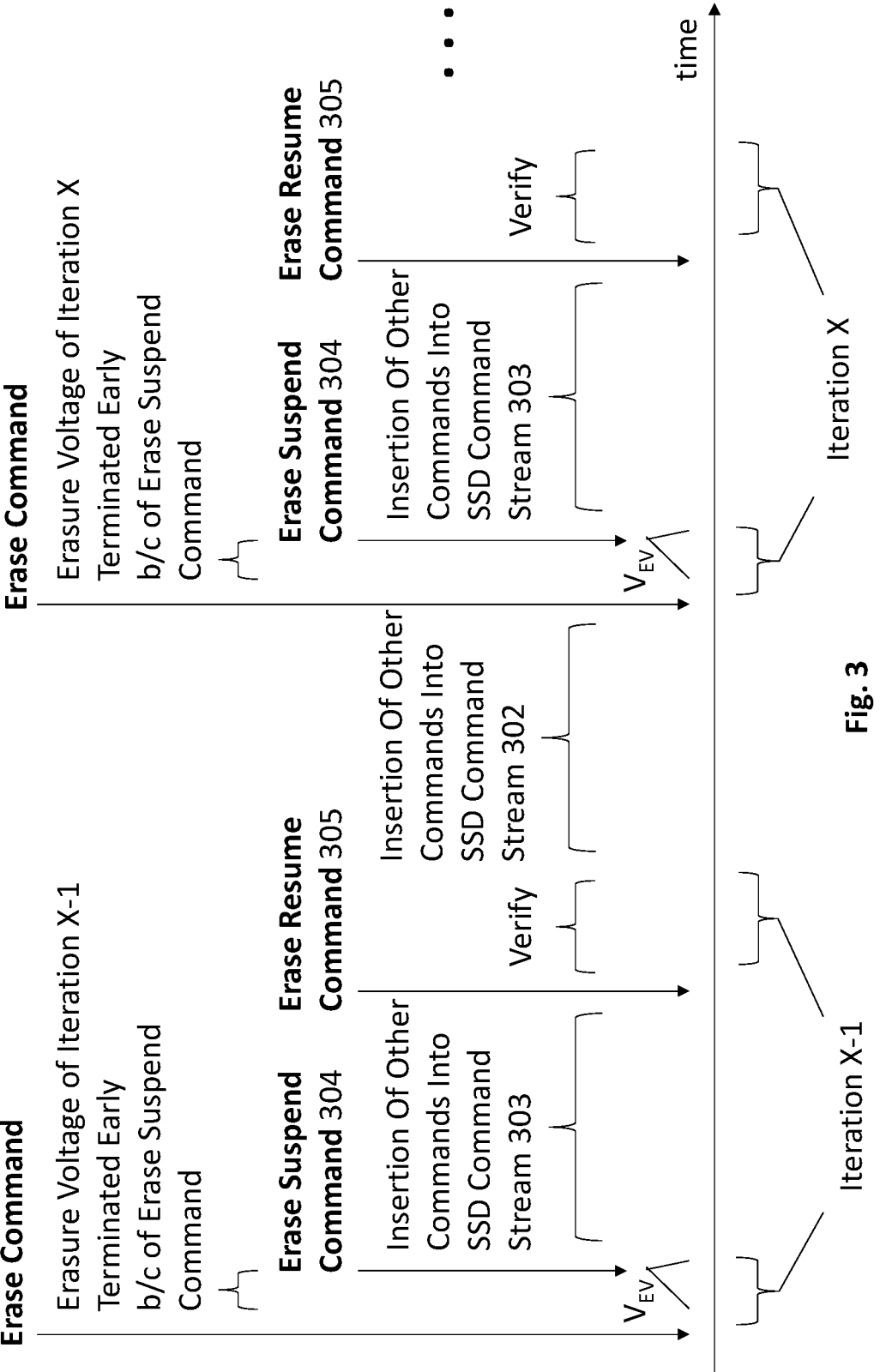
FIG. 3 depicts an improved flash memory erasure process.

As such, FIG. 3 shows a further improvement in which each individual erasure iteration can be suspended by the SSD controller so that, e.g., commands/operations targeted to the same NAND memory chip targeted by the erasure can be inserted in between different segments of a single erasure iteration. That is, as observed in FIG. 3, other operations 303 are inserted into both of the X-1$^{th}$ and X$^{th}$ erasure iterations. In both of these erasure iterations, the application of the erasure voltage $V_{EV}$ is terminated early in response to the SSD controller having sent an erase suspend command 304 so that the other operations 303 can be inserted into the SSD command stream to the NAND memory device in the timeframe over which the erasure voltage would normally have been applied.

The suspension of the erasure ends when the SSD controller sends a subsequent erase suspend command 305. Because the erasure voltage was terminated early, as observed in FIG. 3, the verify process for the suspended erasure iteration is performed in response which formally completes the iteration (as described in more detail below the verify operation may or may not be performed depending on what phase the erasure voltage was in when it was terminated).

Also, note that other commands/operations 302 are also inserted between iterations. That is, the improvement of FIG. 3 is built into a system that also performs the improvement discussed above with respect to FIG. 2. With other operations being inserted not only between erasure iterations 302 but also within erasure iterations 303, the performance of the SSD is largely maintained from the perspective of the users of the SSD as a whole even if extended iterations are needed to fully erase a block.

Figure 4:
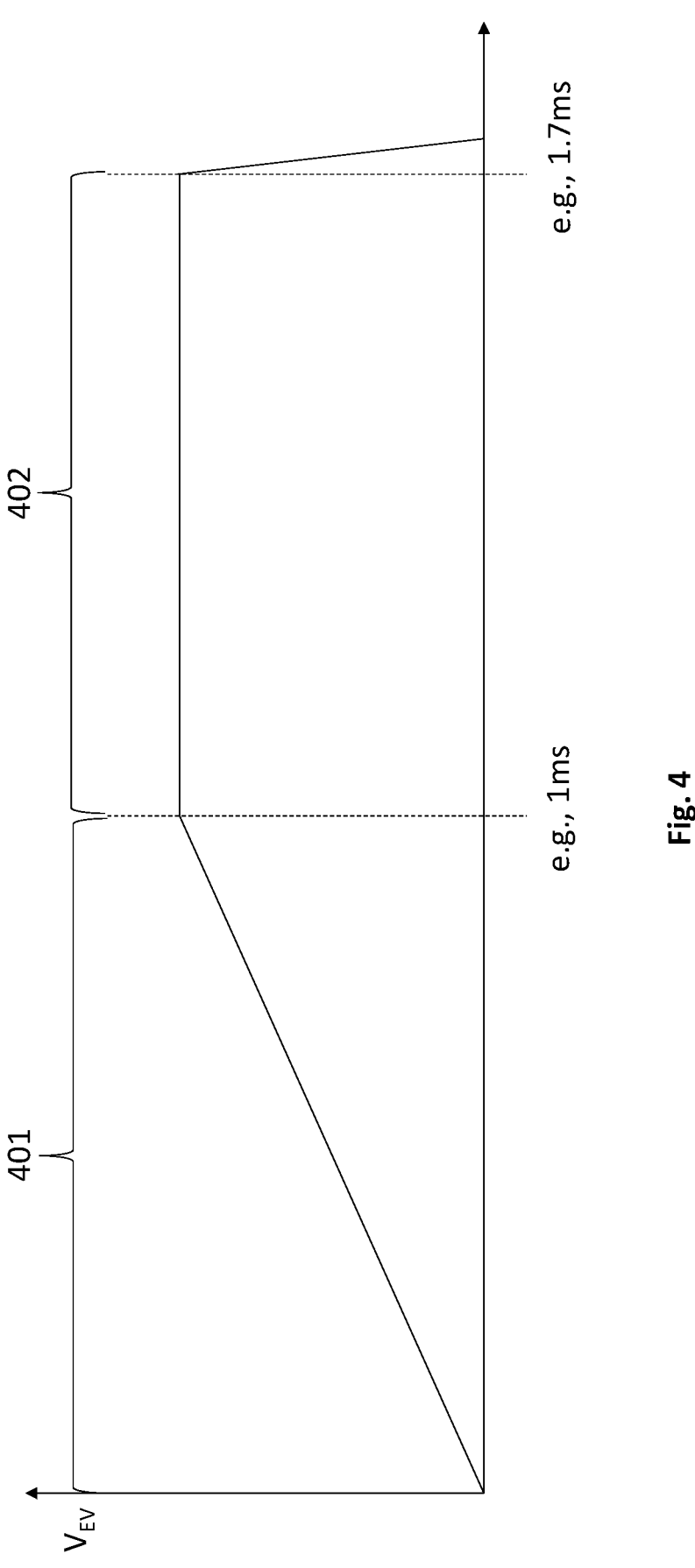
FIG. 4 depicts a nominal erasure voltage waveform.

The ability to suspend a single erasure iteration stems from the lengthy amount of time consumed by a single erasure iteration. Here, as observed in FIG. 4, a single erasure iteration entails an extended ramp-up time 401 needed to ramp the erasure voltage up to the correct voltage level for the instant iteration, followed by sustained application of the erasure voltage level (flattop region 402) so that as many cells as possible will be coerced into reaching the erased state. As observed in the exemplary erasure voltage of FIG. 4, the ramp-up time can consume as much as 1 ms and the flattop region 402 can consume as much as 0.7 ms. Again, as modern day SSD devices desire access speeds in the micro-seconds (µs), a single erasure iteration can consume an order of magnitude more time that, e.g., a read command. As such, hundreds or even thousands of read operations could be performed over the timeframe of a single, fully performed erasure iteration.

A challenge however is that suspension of a single erasure iteration, without proper precautions, can decrease the efficiency of the erasure process, which, in turn, would require more iterations per erasure. With more iterations per erasure not only is more total time consumed per erasure, but also, cell reliability is stressed because higher erasure voltages might be applied (each next erasure iteration traditionally includes a stepped up erasure voltage). Without adequate precautions, the former corresponds to a less improved speed-up with the improved approach while the former corresponds to decreased SSD reliability with the improved approach.

Figure 5A:
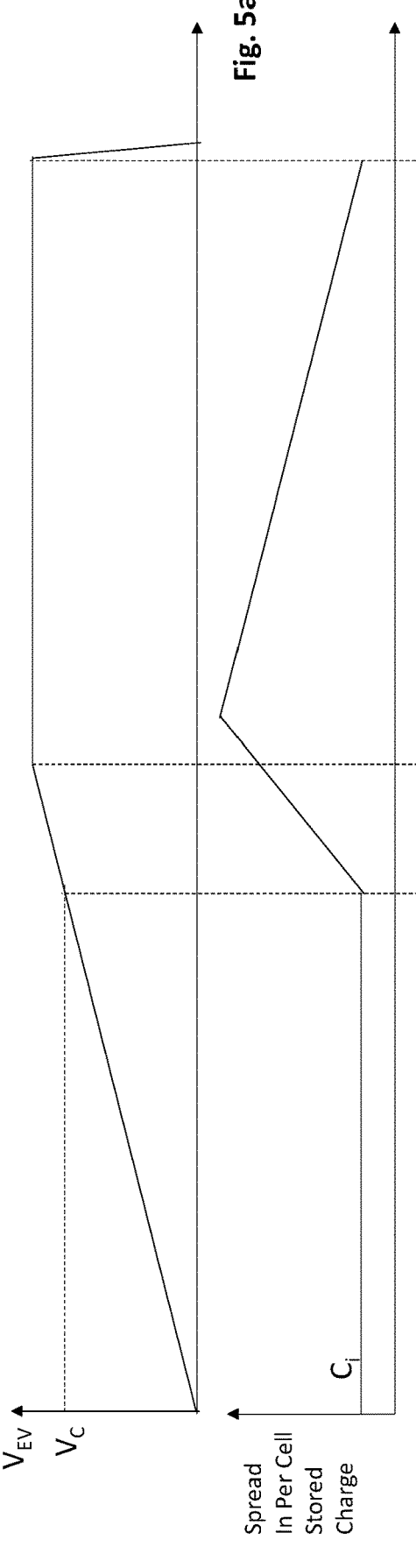
FIG. 5a depicts the spread of stored charge per cell as a function of a nominally applied erasure voltage.
Figure 5B:
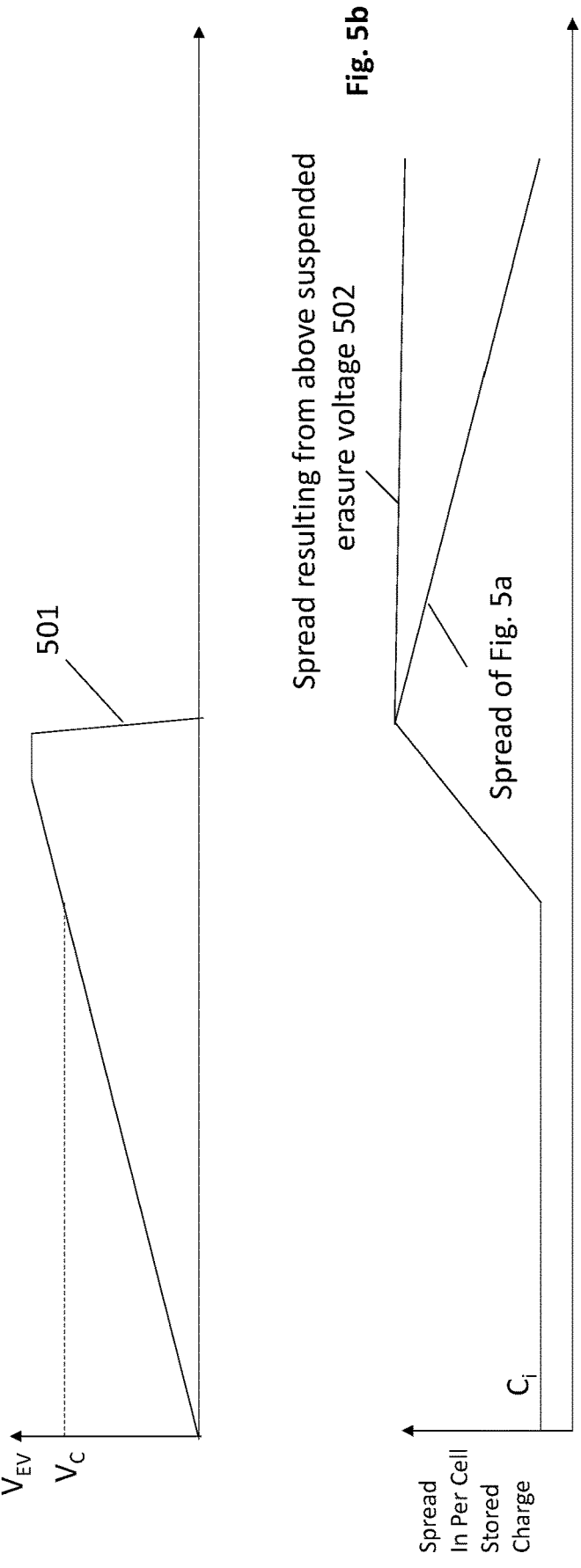
FIG. 5b depicts the spread of stored charge per cell as a function of an applied erasure voltage that is terminated early.

FIGS. 5a and 5b depict a qualitative view of the effects that suspension of an applied erasure voltage can have on the cells of the block as a function of when the erasure voltage is suspended. Here, generally, detrimental effects are observed as an increased spread is the charge held in the cells after the erasure voltage is removed. An increased spread in such charge essentially translates into more cells that are slow to respond to the applied erasure voltage.

FIG. 5a shows a typical applied erasure voltage waveform and the aforementioned spread as a function over the time that the erasure voltage is applied. That is, FIG. 5a shows nominal spread behavior according to traditional approaches whereby the entire sweep of erasure voltage is applied from ramp-up, through the flattop and then removal. As can be seen, in the case of a traditional single erasure iteration, at the onset, there is an initial spread $C_i$ in the remaining cells that require erasure (as will become more clear in the following discussion, the initial spread C; is the result of the immediately prior erasure iteration).

As the erasure voltage is in the early stages of its ramp-up the initial spread does not substantially change because the erasure voltage has not yet reached a critical level $V_C$ beyond which cells are coerced (that is, the cells remain unaffected by the application of the erasure voltage).

As the erasure voltage continues to ramp-up, however, eventually the critical level $V_C$ is surpassed and the most easily coerced cells begin to respond to the applied erasure voltage while the remaining cells remain unresponsive (have not begun to be coerced). The coercion of some cells but not others corresponds to an increase in the spread of stored charge per cell. This process continues with more and more cells responding to the ramping up erasure voltage until the spread reaches a maximum shortly after the erasure voltage has fully ramped-up. At this point, for example, the most easily coerced cells have significantly responded to the erasure voltage, cells of average coercivity have demonstrated modest response to the erasure voltage while the least easily coerced cells have demonstrated little/no response.

As the erasure voltage continues to be applied over time, ideally, cells of average coercivity and at least some of the least coercive cells gradually continue/begin their response, which, in turn, corresponds to a reduction in the spread of the charge stored by the cells. Eventually, by the end of the application of the erasure voltage, the cells have for the most part completed their response to the particular erasure voltage level. Ideally many cells have significantly responded such that they are deemed to be properly erased and are removed from the next erasure iteration.

Commonly there are at least some remaining cells that fell short of responding significantly enough to be deemed erased and will need application of an even higher erasure voltage on the next iteration. The mixture of cells that have responded to the point of erasure and those that have not corresponds to a remnant spread of stored cell charge that will correspond to the initial spread for the next iteration. As can be seen, commonly, the spread amongst cells remains approximately constant from iteration to iteration.

Inset FIG. 5b shows a comparable graph of stored charge spread if the erasure process is suddenly suspended in the middle of the application of the erasure voltage. Here, if the erasure voltage 501 is suddenly suspended in the middle of its application, the gradual narrowing of the spread as is present in the traditional approach of FIG. 5a suddenly ceases leaving a comparatively larger spread 502.

Here, the modestly coerced to lesser coerced cells that nevertheless show some response over time in the traditional approach of FIG. 5a, and largely contribute to the narrowing of the spread observed in FIG. 5a, essentially cease any further response after suspension of the applied erasure voltage in FIG. 5b. With a large number of cells exhibiting less response to the erasure voltage, the suspension of the applied erasure voltage causes a larger number of lagging cells which increases the spread and/or changes the distribution of the spread so that more cells need higher erasure voltages as compared to the traditional erasure approach. More cells needing higher erasure voltages can translate, as described above, into more needed erasure iterations and/or higher erasure voltages and corresponding reliability problems.

Further studies have shown that the spread can even increase iteration over iteration. For example, if the erasure voltage is suspended during ramp-up over each of eight consecutive erasure iterations, the spread will grow by 25% from the first the eight erasure. Thus, if an erasure voltage is to be suspended mid-application, precautions need to be made as to when and/or how its suspension is permitted to take place in view of where the erasure voltage waveform is along its curve.

Figure 6:
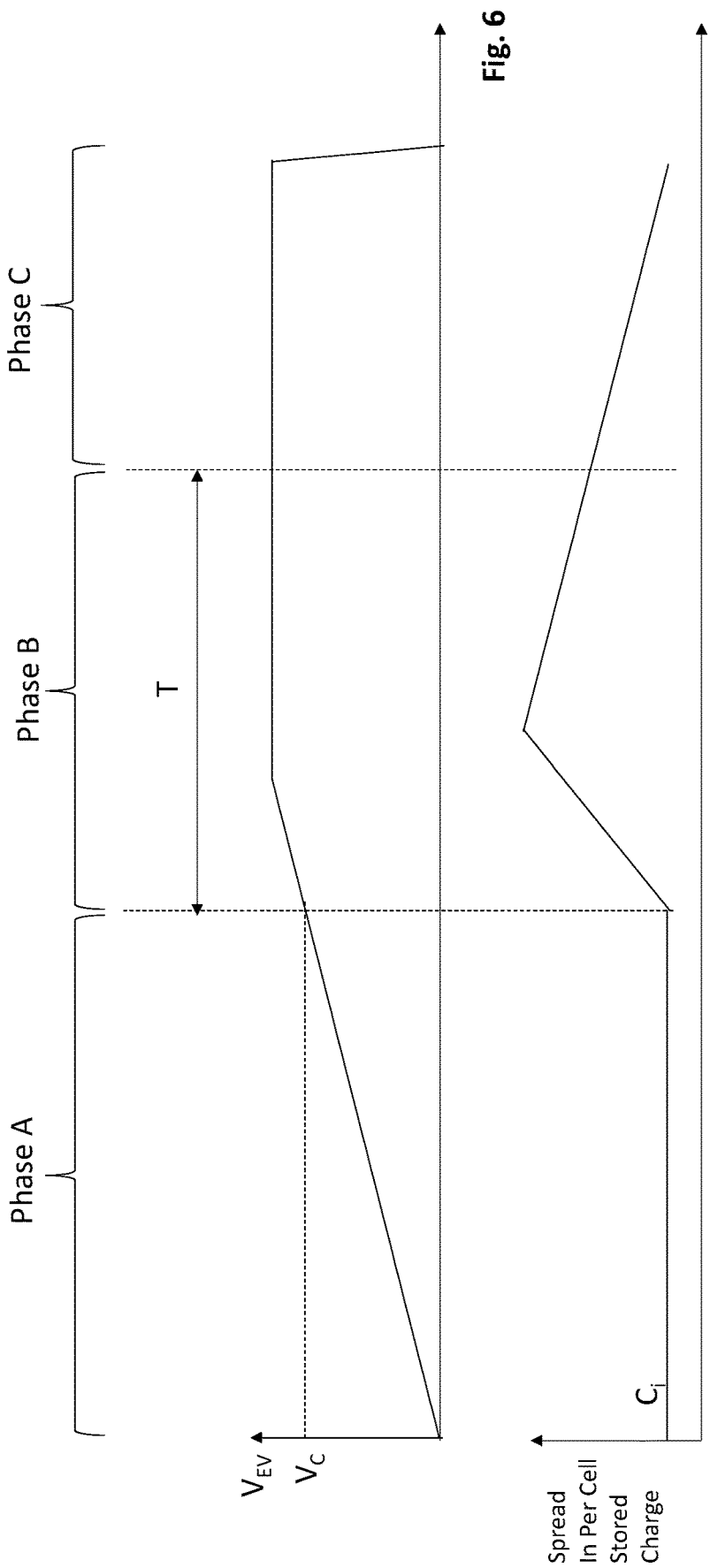
FIG. 6 shows three phases of an erasure voltage waveform.

FIG. 6 shows an approach where the erasure voltage waveform of a single erasure iteration is deemed to be composed of three-different phases (A, B and C) and the extent to which the erasure voltage can be suspended in response to a received erasure suspend command is determined by which phase the erasure voltage is in when an erase suspend command is received.

As observed in FIG. 6: 1) phase A corresponds to the beginning of the erasure iteration during the erasure voltage ramp-up but prior to the critical erasure voltage level $V_C$ beyond which cells will begin to be coerced; 2) phase B includes the portion of ramp-up after the critical level $V_C$ where cell coercion begins and also includes a leading portion of the flat-top region of the erasure waveform; and, 3) phase C includes the remaining portion of the flat-top region.

Accordingly, in light of the discussion above with respect to FIGS. 5*a* and 5*b*, if the erasure voltage is suspended during phase A, no increase in spread is expected because the erasure voltage has not reached the threshold voltage $V_C$ beyond which cells begin to respond. If the erasure voltage is suspended during phase A, there will be no significant change in the state of the block being erased. That is, not having actually received a meaningful erasure voltage, the block being erased will largely maintain the same state that existed when the prior erasure iteration was completed. Thus, in an embodiment, if the an erase suspend command is received while the erasure step is in phase A, the suspension is immediately implemented (the erasure voltage ramp-up immediately ceases).

By contrast, if an erasure suspend command is received while the erasure voltage waveform is in phase B, the application of the erasure voltage is not immediately suspended, but rather, is allowed to continue for an amount of time. In various embodiments, the amount of time that the erasure voltage remains applied is set such that: 1) when the erasure voltage is finally removed, substantial expansion of cell spread from the prior iteration has been avoided; and, 2) the early suspension of the erasure voltage results in a meaningful early end to the erasure step so that a respectable number of other commands can be inserted into the SSD controller's command stream to the NAND memory device that is being targeted by the erasure.

For example, according to one embodiment, if an erase suspend command is received while the erase voltage waveform in within phase B, the erase voltage is maintained for amount of time T that approximately corresponds to the time distance of phase B itself.

Figure 7A:
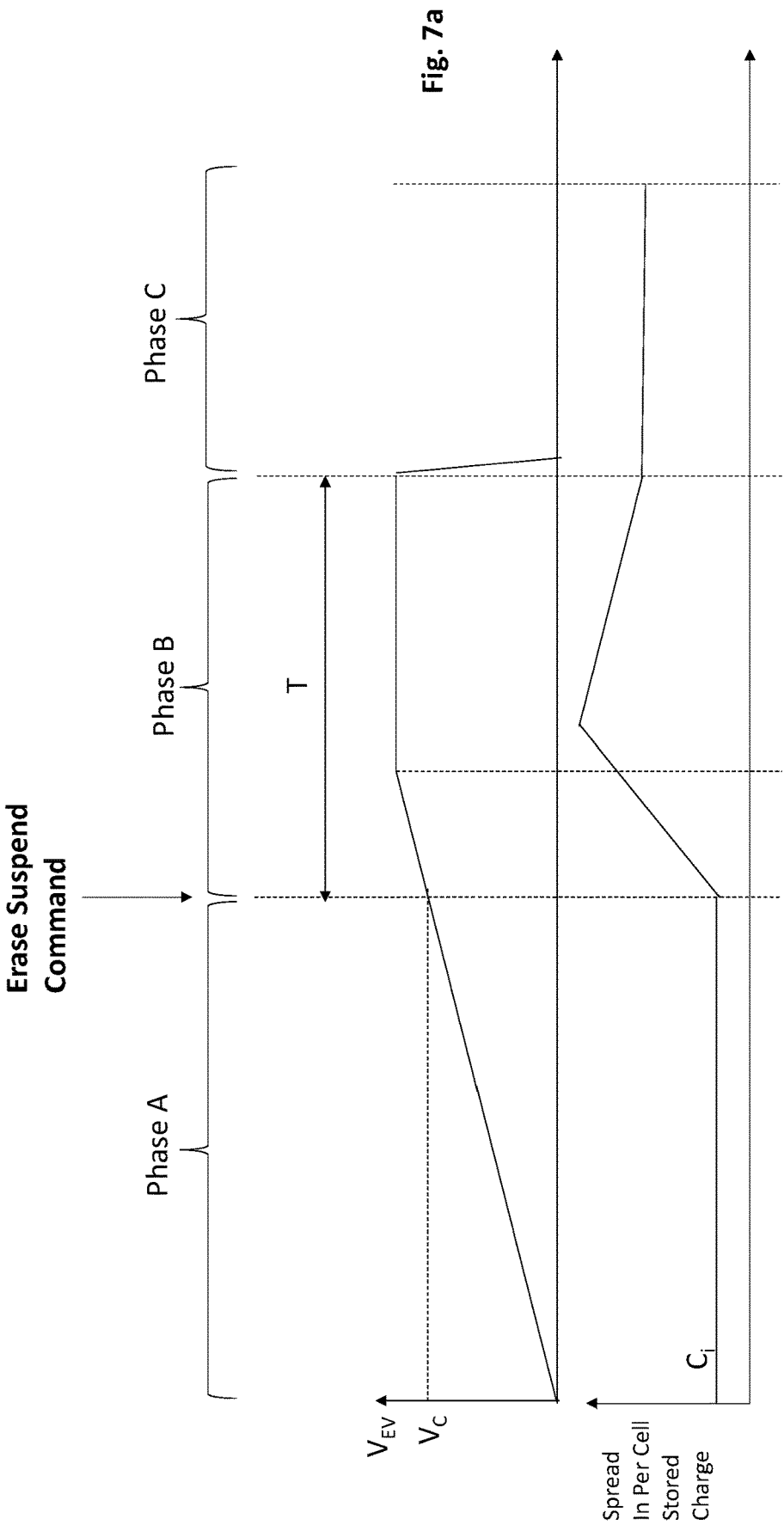
FIGS. 7a and 7b depict the spread of stored charge per cell as a function of an applied erasure voltage for two early terminated erasure voltages.

Here, under a worst case scenario, shown in FIG. 7*a*, if the erase suspend command is received at the transition from phase A to phase B, the erase voltage will continue to be applied through phase B. By applying the erase waveform voltage through phase B, most of the responsivity of all the cells will be realized resulting in a sufficiently narrowed cell stored charge spread. That is, setting the cutoff at approximately at the end of phase B results in meaningful erasure with a sufficiently narrowed charge spread and a meaningful amount of time left (approximately the timespan of phase C) for the purposes of receiving other intervening commands from the SSD controller.

Figure 7B:
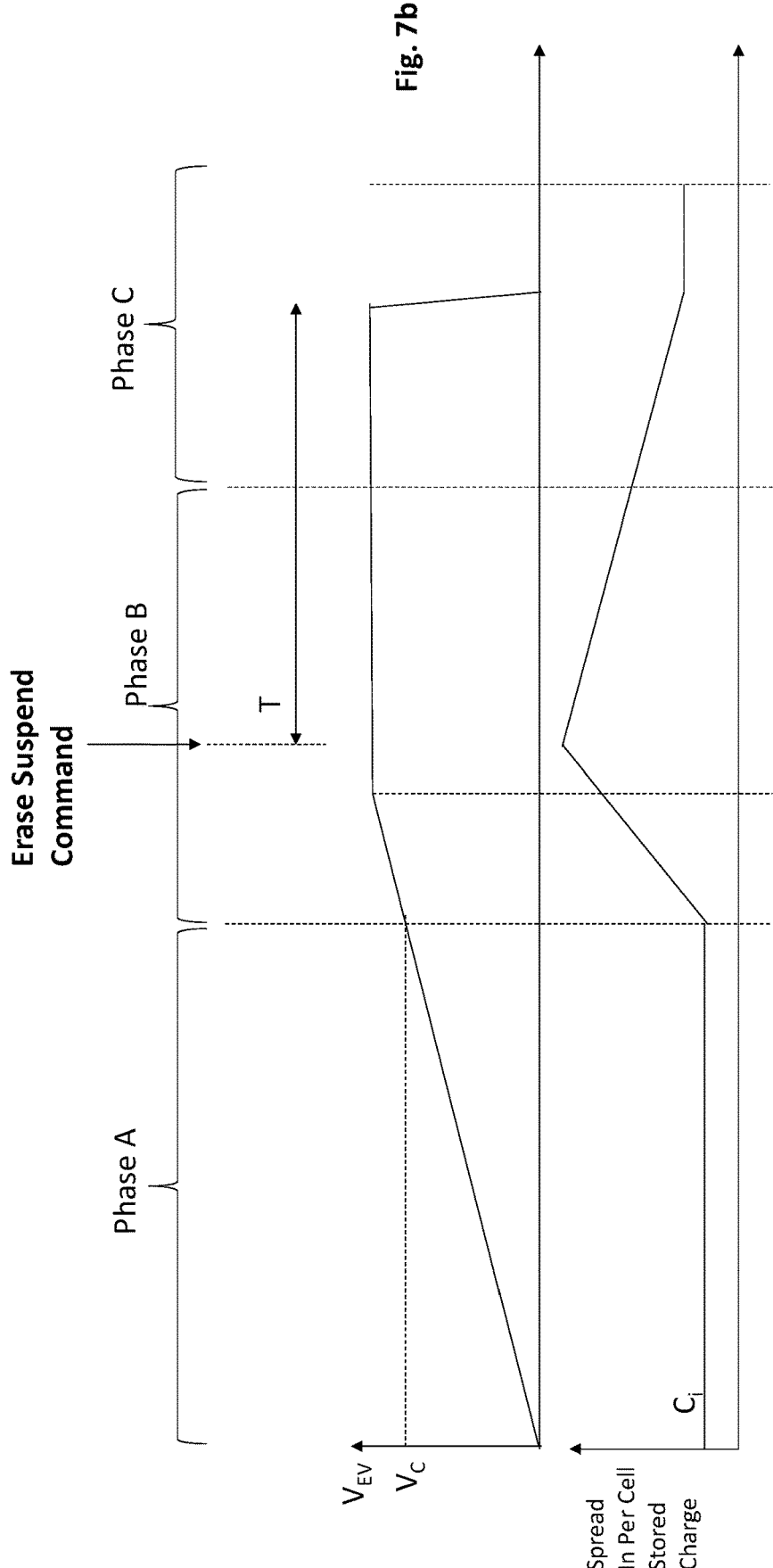

FIG. 7*b* shows another scenario where the erasure suspend command is received deeper into execution of phase B. In this case, by keeping the erasure voltage applied for the next T timespan, the erasure voltage is applied deeper into phase resulting in even less spread when the erasure voltage is finally cutoff (as compared to the scenario of FIG. 7*a*). Note in this particular example, if the erasure suspend command is received toward the end of phase B, the next timespan T would extend beyond the end of phase. In this case, the erasure voltage would ramp-down at its nominally scheduled time at the end of phase C rather than extending beyond phase C.

Embodiments can vary on the exact time length of T. FIGS. 7*a* and 7*b* are directed to a particular embodiment where T is approximately the same as the time length of phase B. In other embodiments T can be shorter than the time span of phase B or longer than the time span of phase B. For example, if a flash technology shows more pronounced spread narrowing in the earlier regions of the flattop, T can be made shorter than phase B. By contrast, if a flash technology shows more gradual spread narrowing in the earlier regions of the flattop, T can be made longer than phase B.

In various alternate embodiments, the later the erase suspend command is received in phase B, a number of options are available depending on how long the applied erasure voltage is applied after receipt of the erasure suspend command and where the phase B to phase C transition is on the flat-top region.

For example, according to one alternative embodiment, if the erase suspend command is received in the later regions of phase B and sustaining the erasure voltage for its allotted time will cause it to run through the end of phase C, the erasure could be cut-off sometime during phase C to allow for the insertion of other commands in the SSD command stream.

In yet another alternative embodiment, if an erase suspend command is received in phase B the erasure voltage is applied through the end of phase B so that all other commands are inserted throughout the entirety of phase C.

Regardless, according to various embodiments, if the erase suspend command is received in phase C, the erase voltage waveform is allowed to continue to its nominal completion (the erase suspend command was received too late to bother interrupting the erase iteration). In an alternate embodiment, the erasure voltage is immediately cut off if an erase suspend command is received during phase C or at least at or before the mid-point of phase C (on the premise that enough cells have been coerced).

Referring briefly back to the handling of an erase suspend command during phase A, note that if a series of erase suspend commands are received over a number of consecutive erasure iterations in phase A the block being erased will never be erased (the erasure voltage is immediately cut off prior to reaching $V_C$ and the block holds the state from its prior iteration). As such, in various embodiments, a counter is maintained that counts how many iterations of the overall erasure have been suspended in phase A.

Once the counter reaches a threshold, any further erase suspend commands that are received in phase A are ignored (the erasure voltage waveform is fully applied through its completion). In an alternate embodiment, the erasure voltage waveform is cutoff but only after it has been applied through phase B. So doing results in eventual erasure of the block even if erase suspend commands continue to be received in phase A.

In various embodiments, if an erase suspend command is received in phase A and the counter threshold has not reached the threshold resulting in immediate termination of the erasure voltage, no verify sequence is performed at the end of the iteration. Here, since the block's state has not changed since the end of the immediately prior iteration, the previous verify operation's results (which determines which cells still are not yet erased and need another iteration with stepped up erasure voltage) are used for the next iteration. Additionally, since the voltage level of the erasure voltage was never truly reached, the next iteration will assume the voltage level of the waveform that was just immediately terminated rather than increment to a next higher level.

Accordingly, in such embodiments, a subsequent verify sequence is performed for all other scenarios (erase suspend command received in phase A is ignored because count threshold has been reached, erase suspend command received in phase B, erase suspend command received in phase C).

Figure 8:
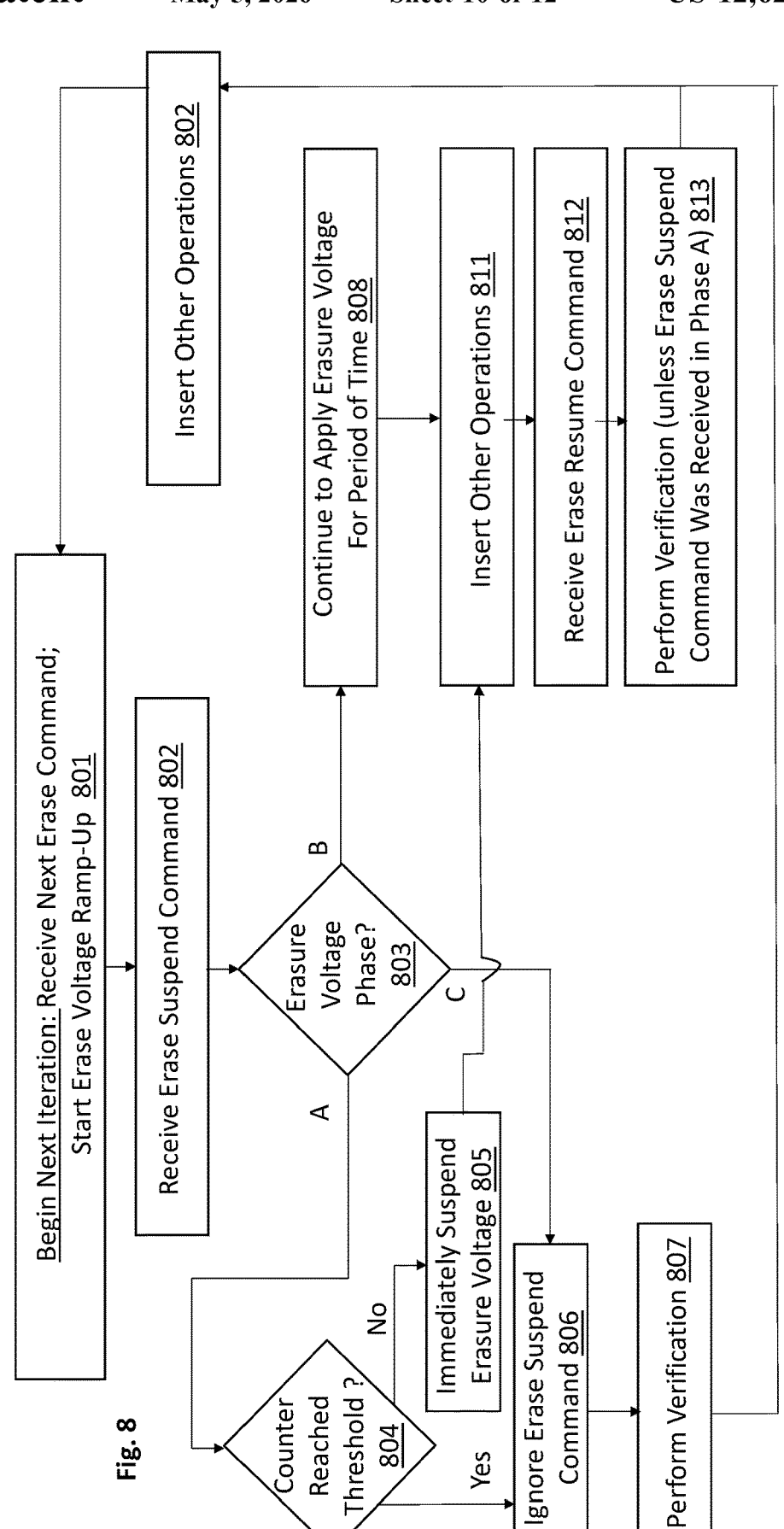
FIG. 8 shows a flow diagram for suspending an erasure iteration.

FIG. 8 shows a flow diagram that outlines an embodiment of a method for handling an erase suspend command during application of an erasure voltage during an erasure iteration. As observed in FIG. 8, an erase command is received, erasure iteration starts and the erasure voltage begins to ramp up 801. While the erasure voltage is being applied an erase suspend command is received 802. The subsequent erasure voltage waveform is then dependent on what phase the waveform is in when the erase suspend command was received 803.

If the erasure voltage waveform is in phase A, the value of a counter is checked 804 (the counter counts how many iterations of the overall erasure process have been suspended in phase A). If the counter has not yet reached a threshold, the counter is incremented and the erasure voltage is immediately suspended 805. The SSD controller is then free to issue other commands/operation during the suspended erase iteration 811 followed by an erase resume command 812. Because no real erasure voltage was applied, verification is not performed and the erasure sequence waits for the next iteration (reception of next erase command). If the counter has reached the threshold, the erasure voltage is not suspended and is applied through completion 806. Verification is performed 807 and the erasure sequence waits for the next iteration.

By contrast, if the erase suspend command is received while the erasure voltage waveform is in phase B, the erasure voltage continues to be applied for a period of time 808. Here various ones of the aforementioned embodiments are possible (set time T, until transition from phase B to phase C is reached, until some point within phase C is reached, etc.). After the period of time is expired, the SSD controller is free to issue other commands during the suspended erase iteration 811 followed by an erase resume command 812. Verification is then performed 813 and the erasure sequence waits for the next iteration (reception of next erase command). Although not depicted in FIG. 8, if the period of time extends deep into phase C or the end of phase C, the insertion of other operations 811 is not executed.

If the erase suspend command is received while the erasure voltage waveform is within phase C, the erasure voltage continues to completion at the end of phase C 806 (the erase suspend command is effectively ignored), verification is performed 807 and the erasure sequence waits for the next iteration (reception of next erase command).

Figure 2:
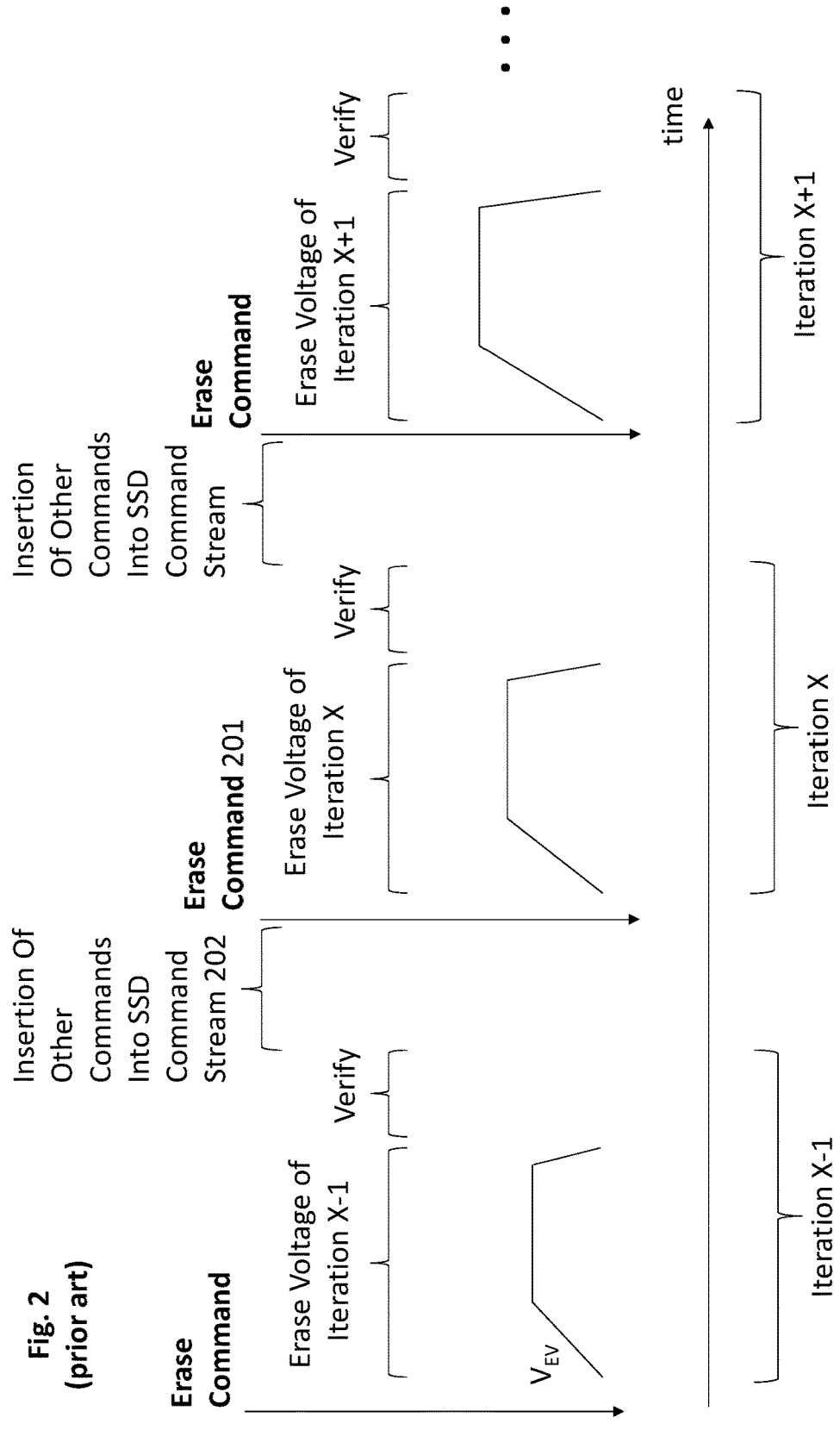
FIG. 2 (prior art) depicts another flash memory erasure process.

In between iterations, the SSD controller is also free to insert other operations 802 as per the discussion of FIG. 2.

Above embodiments have focused on an asynchronous erase suspend command approach in which the SSD controller abruptly sends an erase suspend command and the targeted NAND flash memory device has the appropriate logic to carry out the suspension as described at length above. Upon an erase resume command being sent by the SSD controller to the NAND flash memory device, the NAND flash memory device performs verification and then waits for the next erase command. In alternate embodiments, the NAND flash memory device performs verification (if verification is to be performed) before the erase resume command is received.

Additional alternate embodiments can further granularize the command sequence from the SSD controller so that the SSD has full control over the voltage suspension mechanism. For example, according to one approach, the SSD understands what phase the NAND memory device is in when it decides to suspend the erasure iteration. In further embodiments of this approach, the SSD controller sends an explicit command to enter each phase (e.g., enter phase A, enter phase B, enter phase C) which causes the NAND flash memory device to apply the correct erasure voltage waveform for the particular phase that has been entered.

Figure 9:
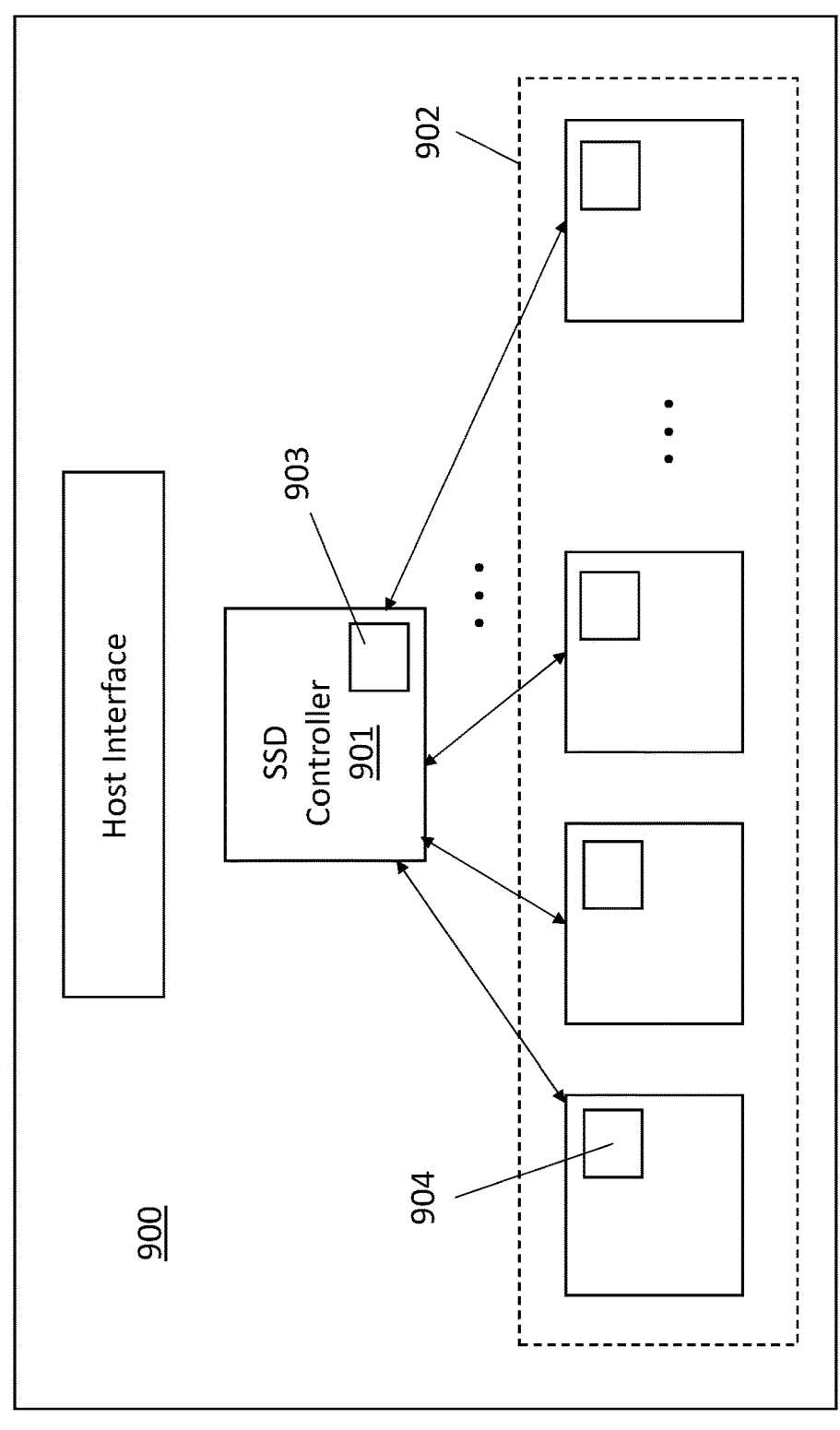
FIG. 9 shows an SSD

FIG. 9 shows an SSD 900 that has been incorporated with any/all of the embodiments described above. Here, the SSD 900 includes a controller 901 and multiple NAND flash memory chips 902. In various embodiments the SSD controller 901 and the multiple NAND flash memory include respective logic 903, 904 to carry out the above described techniques. In various embodiments, various register space exists in the NAND flash memory and/or SSD controller to set certain programmable parameters of the above described techniques.

These can include any/all of: 1) ramp-up time; 2) flattop time; 3) erasure voltage; 4) erasure voltage increment per erasure iteration; 5) $V_C$; 6) transition from phase A to phase B; 7) transition from phase B to phase C; 8) amount of time erasure voltage is permitted to endure after receiving a suspend erase command in phase B; 9) when the erase voltage is to be terminated after receiving an erase suspend command in phase B (set time before end of phase B, end of phase B, set time within phase C, etc.). To the extent the memory devices include any such register space the SSD controller includes logic circuitry to write to such register space.

The logic 903, 904 can be implemented with any of hardwire, custom logic circuitry, programmable logic circuitry (e.g., field programmable logic circuitry) and/or logic circuitry that executes some form of program code such as firmware of the SSD 900. In various embodiments, whether or not to suspend an erasure iteration depends on the state of pending operations as observed by the SSD controller. For example if the SSD controller observes some threshold of read operations that target the NAND flash memory being erased, the SSD controller then decides to suspend the erasure iteration.

Figure 10:
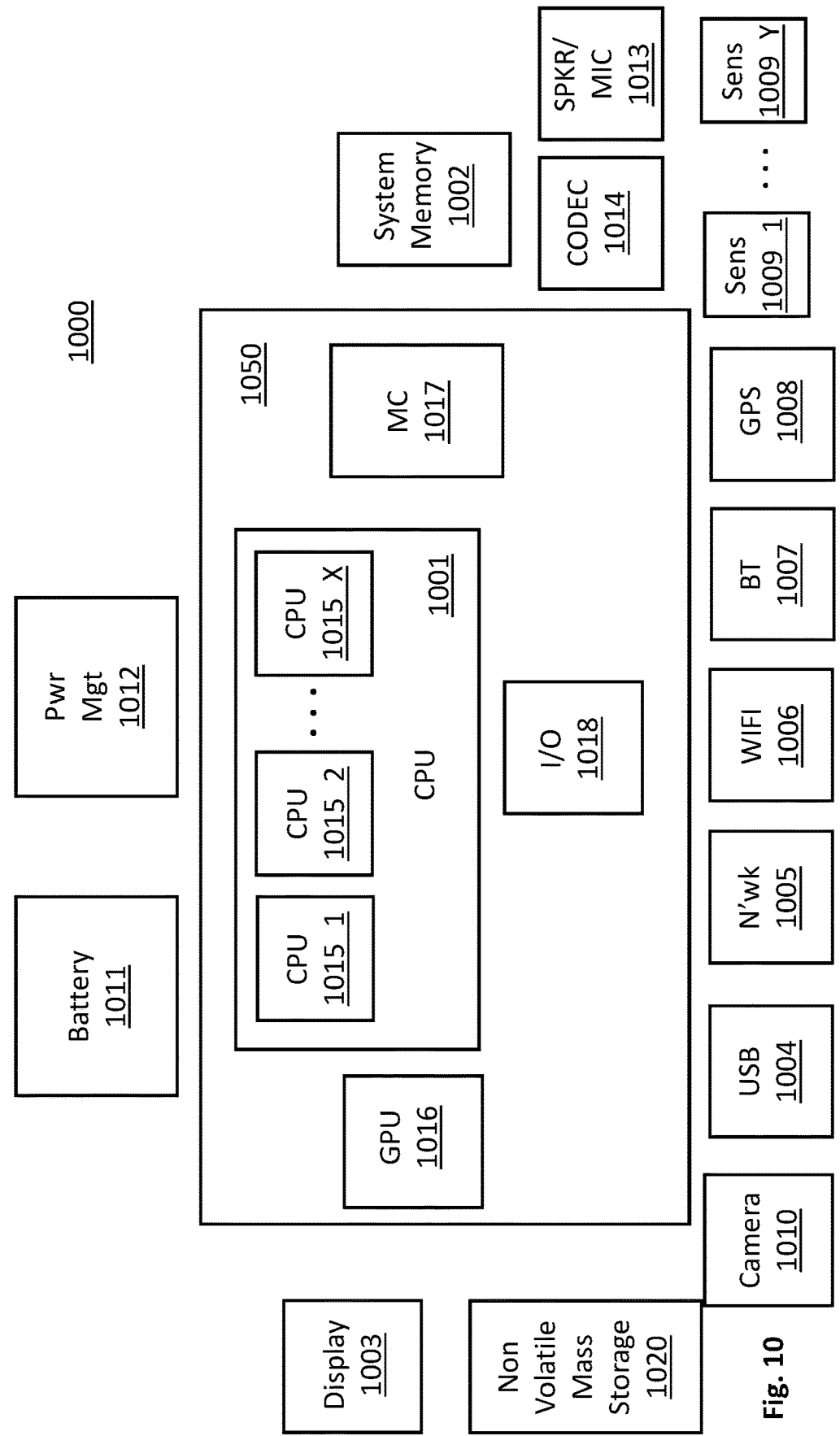
FIG. 10 shows a computing system.

FIG. 10 provides an exemplary depiction of a computing system 1000 (e.g., a smartphone, a tablet computer, a laptop computer, a desktop computer, a server computer, etc.). As observed in FIG. 10, the basic computing system 1000 may include a central processing unit 1001 (which may include, e.g., a plurality of general purpose processing cores 1015_1 through 1015_X) and a main memory controller 1017 disposed on a multi-core processor or applications processor, system memory 1002, a display 1003 (e.g., touchscreen, flat-panel), a local wired point-to-point link (e.g., USB) interface 1004, various network I/O functions 1005 (such as an Ethernet interface and/or cellular modem subsystem), a wireless local area network (e.g., WiFi) interface 1006, a wireless point-to-point link (e.g., Bluetooth) interface 1007 and a Global Positioning System interface 1008, various sensors 1009_1 through 1009_Y, one or more cameras 1010, a battery 1011, a power management control unit 1012, a speaker and microphone 1013 and an audio coder/decoder 1014.

An applications processor or multi-core processor 1050 may include one or more general purpose processing cores 1015 within its CPU 1001, one or more graphical processing units 1016, a memory management function 1017 (e.g., a memory controller) and an I/O control function 1018. The general purpose processing cores 1015 typically execute the system and application software of the computing system. The graphics processing unit 1016 typically executes graphics intensive functions to, e.g., generate graphics information that is presented on the display 1003. The memory control function 1017 interfaces with the system memory 1002 to write/read data to/from system memory 1002.

The non volatile mass storage 1020 can include one or more SSDs having the ability to suspend an erase iteration mid-flight so that other operations can be inserted to the NAND flash memory device that is undergoing the erasure as described at length above.

Each of the touchscreen display 1003, the communication interfaces 1004-1007, the GPS interface 1008, the sensors 1009, the camera(s) 1010, and the speaker/microphone codec 1013, 1014 all can be viewed as various forms of I/O (input and/or output) relative to the overall computing system including, where appropriate, an integrated peripheral device as well (e.g., the one or more cameras 1010). Depending on implementation, various ones of these I/O components may be integrated on the applications processor/multi-core processor 1050 or may be located off the die or outside the package of the applications processor/multi-core processor 1050. The power management control unit 1012 generally controls the power consumption of the system 1000.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMS, EPROMS, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
a memory; and
a hardware processor coupled to the memory and configured at least to:
  apply an erase voltage to one or more storage cells;
  while applying the erase voltage to the one or more storage cells:
    receive a command to suspend applying the erase voltage to the one or more storage cells;

determine that the erase voltage exceeds a critical voltage;
    determine that an amount of time during which the erase voltage exceeds the critical voltage does not meet a first predetermined threshold; and
    in response to receiving the command to suspend applying the erase voltage to the one or more storage cells, determining that the erase voltage exceeds the critical voltage, and determining that the amount of time during which the erase voltage exceeds the critical voltage does not meet the first predetermined threshold:
      continue to apply the erase voltage to the one or more storage cells for a first period of time; and
      suspend applying the erase voltage to the one or more second storage cells after the first period of time.

2. The apparatus of claim 1 wherein the command to suspend applying the erase voltage to the one or more storage cells is received from a solid state drive (SSD) controller.

3. The apparatus of claim 1, wherein the hardware processor is further configured to:
receive additional commands during the first period of time, wherein the additional commands include one or more read commands.

4. The apparatus of claim 1 wherein the hardware processor is further configured to:
receive additional commands after the one or more storage cells are erased.

5. The apparatus of claim 1, further comprising register space to store at least:
a first value of the critical voltage; and
a second value of the first predetermined threshold.

6. The apparatus of claim 1, wherein the hardware processor is further configured to:
apply a second erase voltage to one or more second storage cells;
while applying the second erase voltage to the one or more second storage cells:
  receive a second command to suspend applying the second erase voltage to the one or more second storage cells; and
  determine that the second erase voltage does not exceed the critical voltage; and
in response to receiving the second command to suspend applying the second erase voltage to the one or more second storage cells and determining that the second erase voltage does not exceed the critical voltage, suspend applying the second erase voltage to the one or more second storage cells for a second period of time.

7. The apparatus of claim 1 wherein the erase voltage is constant for at least a portion of the amount of time.

8. The apparatus of claim 1, wherein the hardware processor is further configured to:
apply a second erase voltage to one or more second storage cells; and
while applying the second erase voltage to the one or more second storage cells:
  receive a second command to suspend applying the second erase voltage to the one or more second storage cells;
  determine that the second erase voltage does not exceed the critical voltage;

in response to determining that the second erase voltage does not exceed the critical voltage, determine that a count of erase suspensions has reached a threshold of erase suspensions;

in response to receiving the second command to suspend applying the second erase voltage to the one or more second storage cells and determining that the count of erase suspensions has reached the threshold of erase suspensions:

determine not to suspend applying the second erase voltage to the one or more second storage cells; and continue to apply the second erase voltage to the one or more second storage cells until the one or more second storage cells are erased.

9. A method, comprising:

applying an erase voltage to one or more storage cells;

while applying the erase voltage to the one or more storage cells:

receiving a command to suspend applying the erase voltage to the one or more storage cells;

determining that the erase voltage exceeds a critical voltage;

determining that an amount of time during which the erase voltage exceeds the critical voltage does not meet a first predetermined threshold; and in response to receiving the command to suspend applying the erase voltage to the one or more storage cells, determining that the erase voltage exceeds the critical voltage, and determining that the amount of time during which the erase voltage exceeds the critical voltage does not meet the first predetermined threshold:

continuing to apply the erase voltage to the one or more storage cells for a first period of time; and suspending applying the erase voltage to the one or more storage cells after the first period of time.

10. The method of claim 9 further comprising:

receiving additional commands after the one or more storage cells are erased.

11. The method of claim 9 further comprising: storing in a register space at least:

a first value of the critical voltage; and a second value of the first predetermined threshold.

12. The method of claim 9 further comprising:

applying a second erase voltage to one or more second storage cells; and while applying the second erase voltage to the one or more second storage cells:

receiving a second command to suspend applying the second erase voltage to the one or more second storage cells; and determining that the second erase voltage does not exceed the critical voltage; and in response to receiving the second command to suspend applying the second erase voltage to the one or more second storage cells and determining that the second erase voltage does not exceed the critical voltage, suspending applying the second erase voltage to the one or more second storage cells for a second period of time.

13. The method of claim 9 wherein the erase voltage is constant for at least a portion of the amount of time.

14. The method of claim 9, further comprising:

applying a second erase voltage to one or more second storage cells; and while applying the second erase voltage to the one or more second storage cells:

receiving a second command to suspend applying the second erase voltage to the one or more second storage cells;

determining that the second erase voltage does not exceed the critical voltage;

in response to determining that the second erase voltage does not exceed the critical voltage, determining that a count of erase suspensions has reached a threshold of erase suspensions;

in response to receiving the second command to suspend applying the second erase voltage to the one or more second storage cells and determining that the count of erase suspensions has reached the threshold of erase suspensions:

determining not to suspend applying the second erase voltage to the one or more second storage cells; and continuing to apply the second erase voltage to the one or more second storage cells until the one or more second storage cells are erased.

15. A non-transitory computer-readable medium containing computer executable instructions that, when executed by a processor, cause the processor to perform a method, the method comprising:

applying an erase voltage to one or more storage cells; and while applying the erase voltage to the one or more storage cells:

receiving a command to suspend applying the erase voltage to the one or more storage cells;

determining that the erase voltage exceeds a critical voltage;

determining that an amount of time during which the erase voltage exceeds the critical voltage does not meet a first predetermined threshold; and in response to receiving the command to suspend applying the erase voltage to the one or more storage cells, determining that the erase voltage exceeds the critical voltage, and determining that the amount of time during which the erase voltage exceeds the critical voltage does not meet the first predetermined threshold:

continuing to apply the erase voltage to the one or more storage cells for a first period of time; and suspending applying the erase voltage to the one or more storage cells after the first period of time.

16. The non-transitory computer-readable medium of claim 15, wherein the command to suspend applying the erase voltage to the one or more storage cells is received from a solid state drive controller.

17. The non-transitory computer-readable medium of claim 15, wherein the method further comprises:

applying a second erase voltage to one or more second storage cells;

while applying the second erase voltage to the one or more second storage cells:

receiving a second command to suspend applying the second erase voltage to the one or more second storage cells;

determining that the second erase voltage does not exceed the critical voltage; and in response to receiving the second command to suspend applying the second erase voltage to the one or more second storage cells and determining that the second erase voltage does not exceed the critical voltage, suspending applying the second erase voltage to the one or more second storage cells for a second period of time; and receiving additional commands during the second period of time, wherein the additional commands include one or more read commands.

18. The non-transitory computer-readable medium of claim 15, wherein the method further comprises:

receiving additional commands after the one or more storage cells are erased.

* * * * *